United States Patent [19]
Gruenwald et al.

[11] Patent Number: 5,784,779
[45] Date of Patent: Jul. 28, 1998

[54] METHOD FOR JOINING AN ELECTRICAL CONNECTION OF A NON-PACKAGED IC COMPONENT WITH A CONDUCTIVE STRIP ON A SUBSTRATE

[75] Inventors: Werner Gruenwald, Gerlingen; Ralf Haug, Leonberg; Martin Seyffert; Frank-Dieter Hauschild, both of Hildesheim, all of Germany

[73] Assignee: Robert Bosch GmbH, Stuttgart, Germany

[21] Appl. No.: 727,541

[22] PCT Filed: Mar. 12, 1996

[86] PCT No.: PCT/DE96/00432
§ 371 Date: Oct. 22, 1996
§ 102(e) Date: Oct. 22, 1996

[87] PCT Pub. No.: WO96/36991
PCT Pub. Date: Nov. 21, 1996

[30] Foreign Application Priority Data
May 20, 1995 [DE] Germany ............ 195 18 659.1

[51] Int. Cl.⁶ .................. H05K 3/32; H05K 3/18; H05K 13/04
[52] U.S. Cl. ............... 29/840; 29/834; 29/DIG. 12; 228/180.21
[58] Field of Search ............ 29/834, 840, DIG. 12; 228/180.21, 180.22; 427/98, 126.1, 126.6

[56] References Cited

U.S. PATENT DOCUMENTS

| 5,084,961 | 2/1992 | Yoshikawa | 29/840 |
| 5,203,075 | 4/1993 | Angulas et al. | 29/840 X |
| 5,245,750 | 9/1993 | Crumly et al. | 228/180.22 X |
| 5,386,624 | 2/1995 | George et al. | 29/840 X |
| 5,421,081 | 6/1995 | Sakaguchi et al. | 228/180.21 X |

FOREIGN PATENT DOCUMENTS

| 376055 | 7/1990 | European Pat. Off. | 29/840 |
| 5586130 | 6/1980 | Japan | 29/840 |
| 2224256 | 9/1990 | Japan | 29/DIG. 12 |
| 4192596 | 7/1992 | Japan | 29/840 |
| 4320089 | 11/1992 | Japan | 29/DIG. 12 |
| 94/05139 | 3/1994 | WIPO | |

*Primary Examiner*—Peter Vo
*Attorney, Agent, or Firm*—Spencer & Frank

[57] ABSTRACT

A method for joining an electrical connection (10) of a non-packaged IC component (15) with a conductive strip (35) on a substrate (30). An easy to metallize layer (20) preferably is applied to the surface of an electrical connection (10) that is to be connected. The surface (10, 20) to be connected of connection (10) is arranged at a distance to and facing a contact surface (45) of a conductive strip (35) on a substrate (30). An electrically conductive material (50) for filling in the free volume between the two surfaces (10, 20; 45) to be connected is applied simultaneously to the contact surface (45) and the surface (10, 20) to be connected.

7 Claims, 1 Drawing Sheet

METHOD FOR JOINING AN ELECTRICAL CONNECTION OF A NON-PACKAGED IC COMPONENT WITH A CONDUCTIVE STRIP ON A SUBSTRATE

BACKGROUND OF THE INVENTION

PRIOR ART

The invention concerns a method for joining an electrical connection of a non-packaged IC component with a conductive strip on a substrate. In the WO 94/05139, a method for producing finely structured electrically conductive layers on a substrate is described, where a thin activation layer (forming of crystal nuclei) with the desired layer structure is applied to improve the fineness of the structure and contour sharpness, and where a thicker conductive layer made of electrically conductive metal, for example copper (Cu) or nickel (Ni), is then added to the nucleation. This layer is added through precipitation from a galvanized bath or without current from a reduction bath.

With standard joining techniques for mounting an IC component on a substrate, conductive strips are placed on the side of the substrate that faces away from the IC component and are provided with contact surfaces. Throughbores in the substrate and conductive strips are provided to join the IC component to the conductive strip contact surfaces. The IC components are positioned with their connecting surfaces over the throughbores. Thus, each connecting surface covers the associated throughbore. The contact and connecting surfaces are subsequently strengthened chemically with a metal until the metal layers in the throughbore grow together and the electrical connection is formed. The disadvantage of this joining technique is that only thin substrates can be used at moderate temperature stresses. Placing the throughbores in the substrate material is mechanically extravagant and costly. Frequently only certain types of substrate material can be used.

SUMMARY AND ADVANTAGES OF THE INVENTION

The above mentioned disadvantages of the know methods generally are overcome according to the present invention by a method for conductively joining an electrical connection of a non-packaged IC component with a conductive strip on a substrate, with an easy to metallize layer preferably being applied to the surface to be connected of the IC component, wherein a spacing means is applied to the conductive strip outside of a contact surface thereof, the surface to be connected of the IC component and the conductive strip of the substrate are positioned facing each other at a distance, and an electrically conductive material, which fills in the free volume between the two surfaces to be connected is applied simultaneously to the contact surface of the conductive strip and the surface to be connected of the IC component by the precipitation of the electrically conductive material from a galvanized bath or from a reduction bath without current.

The method according to the invention has the advantage that no throughbores are needed in the tight arrangement for the IC connections in the substrate. Thus, the thickness of the substrate material that can be used is not limited. It is possible to have substrates with structures on one side only. Thin substrates or foil substrates do not suffer a weakening of the substrate work piece. The method permits the use of all not encased integrated circuits (IC's), while other flip-chip techniques are for the most part limited to specially pretreated (bumped) IC's. It is possible to realize very short conductive connections with good thermal conductivity and improved high frequency qualities of substrates that are joined in accordance with the invention and the associated components. A damaging of sensitive components through heating during the soldering process is eliminated, and plastic parts can be arranged closer to the substrate. An automation of the method is possible. By reducing the distance between side-by-side arranged connections of the IC component as compared to packaged components, it is possible to save substrate material and material for the conductive strip and the insulating layers with a comparable use range of the circuit.

Further improvements and advantages are achieved with the additionally disclosed measures, as compared to the Prior Art. Contact connections achieved through precipitation of an electrically conductive material are of particularly good quality. Especially well suited for filling the free volume between the surfaces that must be connected are nickel and copper salt solutions in galvanized baths, wherein the current density is freely adjustable and can be changed during the process. An alternative precipitation is possible with metal-containing reaction solutions, which contain a reducing agent such as hydrazine (or formaldehyde) and are obtained commercially. It is standard to select suitable concentrations prior to the precipitation or to add reducing agents or metal-containing solutions during the precipitation. In order to increase the piece numbers for production, the contact surface of the conductive strip contact surfaces that are to be joined must be pretreated to direct the reaction and crystal nuclei formation primarily to those parts that are to be joined and to avoid undesired competing reactions. The adding of large-surface, passivating layers improves the subsequent electrical insulation of the product and avoids the wasting of material during the precipitation of conductive materials. Due to the low temperatures during the precipitation, no undesirable diffusion worth mentioning occurs at the places of contact.

BRIEF DESCRIPTION OF THE DRAWINGS

The invention is explained with the aid of an example and by referring to the enclosed drawings wherein.

DETAILED DESCRIPTION OF THE PREFERRED EMBODIMENT

Figure 1A:
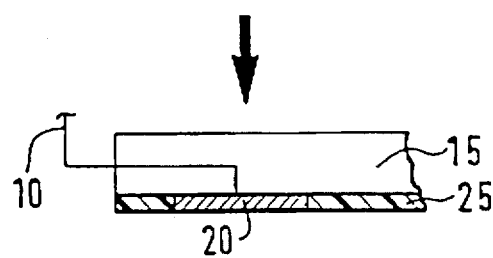
FIG. 1a shows a non-packaged IC component.

FIG. 1a is a drawing of an electrical connection 10 of a non-packaged IC component 15. The surface of connection 10 that is to be connected has an easy to metallize layer 20. The surface to the side of the connection 10 is surrounded with a passivating layer 25 for insulation and to provide mechanical protection.

Figure 1B:
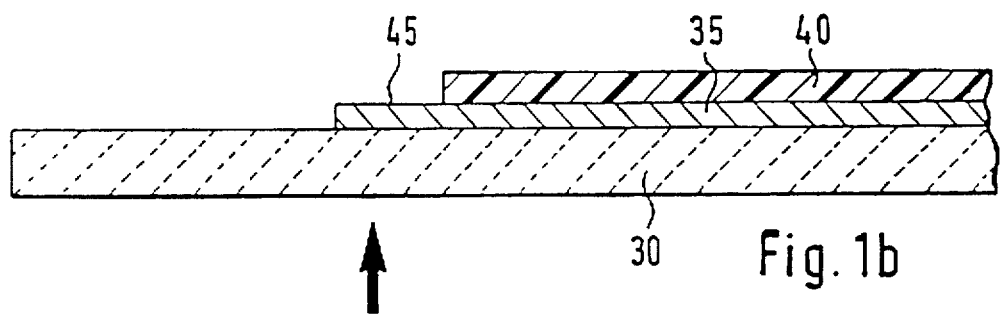
FIG. 1b shows a prepared substrate.

FIG. 1b shows a substrate 30 with a conductive strip 35 that partially covers the surface, and to which a spacing means 40 is applied in such a way that a free, electrically connectable surface remains as contact surface 45 on the conductive strip 35.

Figure 1C:
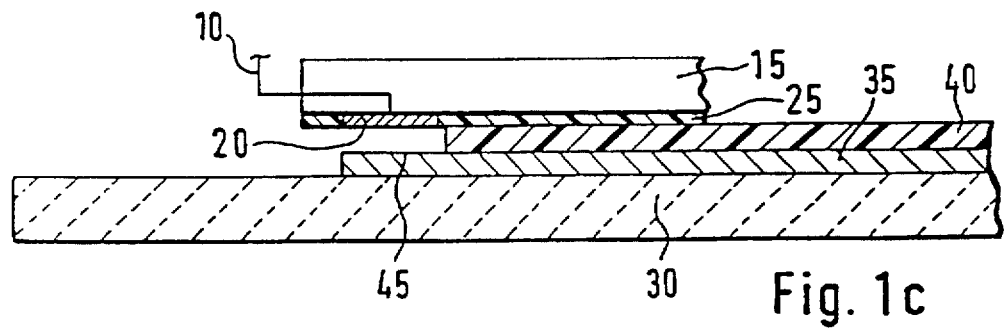
FIG. 1c shows the positioning of the IC component on the substrate.

FIG. 1c shows an IC component according to FIG. 1a on a substrate according to FIG. 1b, wherein the surfaces 20, 45 that are to be connected are facing each other. A suitable positioning is achieved if substrate 30 and IC component 15 are placed one on top of the other, according to the arrows in FIGS. 1c and 1b, in such a way that the surface of the layer 20 to be metallized and the contact surface 45 are facing each other without touching.

Figure 1D:
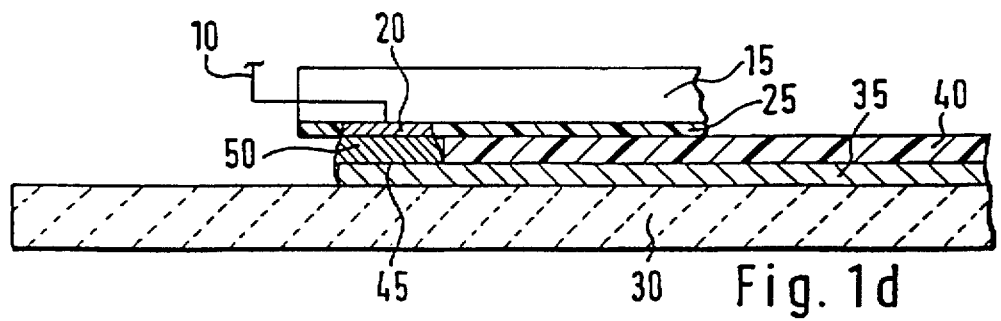
FIG. 1d shows an IC component on the substrate.

FIG. 1d shows the joining of an IC component 15 with a substrate 30. The electrically conducting material 50 fills the free volume between the contact surface 45 and the layer 20 to be metallized.

EXAMPLE 1

By using a thick-layer technique, a paste containing palladic crystal nuclei is applied as metallizable layer 20 to the surface of an electrical connection 10 that is to be connected. In a parallel operation, a copper conductive strip 35 is applied with a standard technique, such as is described, for example, in the DE 35 37 161 A1=U.S. Pat. No. 4,780,332, to an aluminum oxide substrate 30. Except for the copper contact surfaces 45, the copper conductive strip 35 is covered with an insulating layer, for example an epoxy resin layer, as spacing means 40, wherein the thickness of this layer on the conductive strip 35 is adjusted precisely. It is positioned as shown in the drawing for FIG. 1c, and nickel is precipitated as conductive material 50 through simultaneous chemical precipitation of nickel on the layer 20 that is to be metallized and contains palladic crystal nuclei, and on the copper contact surface 45, in accordance with a process described in the WO 94/05139. This precipitation takes place until the nickel layers on opposite sides grow together and connection 10 and the conductive strip 35 are joined electrically. The end of the growing together is, for example, controlled by evaluating the drop shape or resistance measurement for the connection. It is also possible to use another electrical component in place of the IC component.

EXAMPLE 2

A plurality of connections 10 of the IC component 15 are joined simultaneously with conductive strips 35. Otherwise, one proceeds as in example 1.

EXAMPLE 3

The substrate 30 is coated on one side only, wherein the side without a layer forms the outer casing for a device where the IC component 15 is installed on the inside wall if the substrate layer is sufficiently thick. Otherwise, one proceeds as in example 1.

EXAMPLE 4

There is no crystal nuclei formation according to Example 1 of the layer 20 to be metallized. Otherwise, one proceeds as in Example 1.

EXAMPLE 5

The paste for the crystal nuclei formation of the layer 20 to be metallized is applied in the case of very small connection grids with the tampon-printing technique.

EXAMPLE 6

If several connections according to Examples 1 and 2 are produced, it is sufficient to provide the spacing means 40 for the peripheral conducting strips 35 of substrate 30 or at least for three spaced apart conductive strips.

EXAMPLE 7

Precious metals such as Pt, Rh, Pd, Ru, Rh, Au, Ag, Ir, Os, Re or precious metal alloys can be used for the crystal nuclei formation. Otherwise one proceeds as in Example 1.

EXAMPLE 8

As alternative to the preceding examples, the materials listed in the following table are used:

| Part | Materials that can be used |
| --- | --- |
| electrical connection 10, 20 or | Al, Cu, Ni, Ag, Au, Ag/Au-alloy, graphite, Pd |
| conductive strip 25 | conductive plastic; Ag/Pd, Sn, Pt, Rh, Ru, Ir, Os, Re |
| Spacing means 40 | PVC, polyurethane, epoxies, insulating lacquer, polyimide, acrylic resin, acrylate-containing epoxy systems |
| substrate 30 | aluminum oxide ceramics; epoxy; ceramics; polyamide; aramide; porcelain; Si, Pertinax; polyester; polyimide; printed circuit board material; ALN ceramics |
| conductive material 50 | Ni, Cu, Ag, Au, Sn, Pd, alloys of these materials |

We claim:

1. Method for conductively joining a surface of an electrical connection of a non-packaged IC component with a conductive strip on a substrate comprising: applying a spacing means to the conductive strip outside of a contact surface thereof; positioning the IC component relative to the spacing means and the substrate such that the surface to be connected of the IC component and the contact surface of the conductive strip of the substrate are facing each other at a distance to define a free volume there between; and, filling in the free volume between the two surfaces to be connected by applying an electrically conductive material simultaneously to the contact surface of the conductive strip and to the surface to be connected of the IC component by the precipitation of the electrically conductive material from a galvanized bath or from a reduction bath without current.

2. Method according to claim 1, wherein nickel (Ni) is precipitated as the electrically conductive material.

3. Method according to claim 1, wherein the substrates used have only one plane for the conductive strips (one-sided substrate).

4. Method according claim 1, wherein the surface of the IC component is covered on the side facing the substrate with a passivating layer, while the surface to be connected remains uncovered.

5. Method according to claim 1, wherein at least the contact surface for the conductive strip is made from copper (Cu).

6. Method according to claim 1, wherein the spacing means between the IC component and the conductive strip is produced from at least one printed-on spacing means.

7. Method according to claim 1, further comprising applying an easy to metallize layer to the surface of the IC component to be connected prior to the step of positioning.

\* \* \* \* \*